(12) United States Patent
Park et al.

(10) Patent No.: US 9,018,626 B2
(45) Date of Patent: Apr. 28, 2015

(54) ZNO FILM STRUCTURE AND METHOD OF FORMING THE SAME

(71) Applicant: Gwangju Institute of Science and Technology, Gwangju (KR)

(72) Inventors: Seong-Ju Park, Gwangju (KR); Yong Seok Choi, Gwangju (KR); Jang-Won Kang, Gwangju (KR); Byeong Hyeok Kim, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 14/141,119

(22) Filed: Dec. 26, 2013

(65) Prior Publication Data

US 2014/0361288 A1 Dec. 11, 2014

(30) Foreign Application Priority Data

Jun. 7, 2013 (KR) ........................ 10-2013-0065145

(51) Int. Cl.
*H01L 33/28* (2010.01)
*H01L 33/00* (2010.01)

(52) U.S. Cl.
CPC ............ *H01L 33/0083* (2013.01); *H01L 33/28* (2013.01)

(58) Field of Classification Search
USPC ......... 257/43, 14, 51, E31.04, 13, E21.09, 83
See application file for complete search history.

(56) References Cited

U.S. PATENT DOCUMENTS

2012/0043524 A1* 2/2012 Tanaka et al. ................... 257/13

* cited by examiner

*Primary Examiner* — Cathy N Lam
(74) *Attorney, Agent, or Firm* — Lowe Hauptman & Ham, LLP

(57) ABSTRACT

Disclosed herein are a ZnO film structure and a method of forming the same. Dislocation density of a ZnO film grown through epitaxial lateral overgrowth (ELOG) is minimized. In order to block a chemical reaction between the ZnO film and a mask layer at the time of performing the ELOG, a material of the mask layer is $AlF_3$, $NaF_2$, $SrF$, or $MgF_2$. Therefore, the chemical reaction between ZnO and the mask layer is blocked and a transfer of dislocation from a substrate is also blocked.

5 Claims, 3 Drawing Sheets

ZNO FILM STRUCTURE AND METHOD OF FORMING THE SAME

CROSS REFERENCE TO RELATED APPLICATION

This application claims priority to Korean Patent Application No. 10-2013-0065145 on 7 Jun. 2013, and all the benefits accruing therefrom under 35 U.S.C. §119, the contents of which is incorporated by reference in its entirety.

BACKGROUND OF THE INVENTION

1. Technical Field

The present invention relates to a ZnO film, and more particularly, to a ZnO film structure using a growth mask, and a method of forming the same.

2. Description of the Related Art

ZnO has an optical bandgap of 3.37 eV, which is similar to gallium nitride, and may be used as a light source of a near ultraviolet region. In addition, in the case in which ZnO is used to manufacture an optical device, it may secure good quality due to high defect formation energy. In addition, exciton binding energy at room temperature is 60 mev, which is three times higher than that (24 meV) of gallium nitride. Therefore, in a field using an optical device using exciton, a high efficiency optical gain effect may be obtained.

However, at the time of manufacturing a light emitting diode based on ZnO, there is a problem that an optical output is low. This is due to high dislocation density formed in a ZnO film in a process of actually forming the ZnO film as compared with a theoretical advantage. In the case of a ZnO based light emitting diode, dislocation density formed in a film is $10^{11}$ cm$^{-2}$, which is higher than dislocation density ($10^8$ cm$^{-2}$) of a gallium nitride based light emitting diode that has been commercialized. The ZnO based light emitting diode has optical efficiency lower than that of the gallium nitride based light emitting diode due to the high dislocation density. Therefore, in the case of decreasing the dislocation density of the ZnO based light emitting diode, very high optical efficiency may be secured.

In the gallium nitride based light emitting diode, an $SiO_2$ mask is used in order to decrease the dislocation density formed in a film. The $SiO_2$ mask is used, such that an epitaxial lateral overgrowth (ELOG) technology is used in a selective region. Therefore, dislocation transferred from a substrate is blocked by the $SiO_2$ mask, and dislocation density in the gallium nitride film is decreased. To this end, direct growth of the film on the $SiO_2$ mask should be suppressed and lateral growth should be induced so that the gallium nitride film grown from an opened region under the $SiO_2$ mask cover an upper surface of the $SiO_2$ mask.

The $SiO_2$ mask has an advantage that the ELOG technology may be easily used. On the other hand, in the case of growing the ZnO film using the $SiO_2$ mask, a problem that the ZnO film is directly formed on the $SiO_2$ mask occurs. Therefore, it is difficult to form a ZnO single crystal and it is impossible to apply the ELOG technology.

Accordingly, in order to grow a ZnO film, it is requisite to develop a new mask capable of growing the ZnO film in a selective region.

SUMMARY OF THE INVENTION

An object of the present invention is to provide a ZnO film structure using a mask capable of blocking progress of dislocation and having minimized reactivity to ZnO, and a method of forming the same.

According to an exemplary embodiment of the present invention, there is provided a ZnO film structure including: a substrate; mask layers formed on the substrate and exposing a portion of a surface of the substrate; and a ZnO film burying a space between the mask layers therein and formed on an upper surface of the mask layers, wherein the mask layers block a reaction between the mask layers and ZnO.

According to another exemplary embodiment of the present invention, there is provided a method of forming a ZnO film structure, the method including: forming photoresist patterns on a substrate; forming a preliminary mask layer on the substrate on which the photoresist patterns are formed; performing a lift-off process on the photoresist patterns to form patterned mask layers from the preliminary mask layer; and forming a ZnO film filled in a space between the mask layers and covering upper portions of the mask layers.

DESCRIPTION OF THE EXEMPLARY EMBODIMENTS

Figure 1:
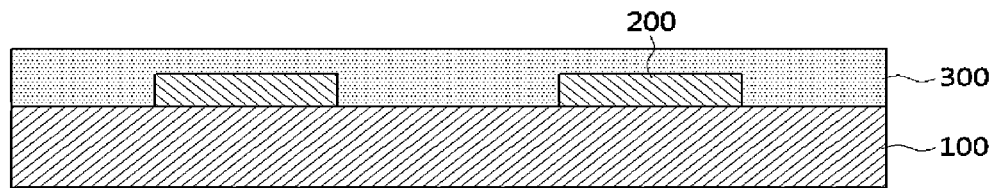
FIG. 1 is a cross-sectional view of a ZnO film structure according to an exemplary embodiment of the present invention in which mask layers are formed on a substrate and a ZnO film is formed through an opened region between the mask layers.

The present invention may be variously modified and have several forms. Therefore, specific exemplary embodiments of the present invention will be illustrated in the accompanying drawings and be described in detail in the present specification. However, it is to be understood that the present invention is not limited to a specific disclosed form, but includes all modifications, equivalents, and substitutions without departing from the scope and spirit of the present invention. In describing the respective drawings, similar components will be denoted by similar reference numerals.

Unless indicated otherwise, it is to be understood that all the terms used in the specification including technical and scientific terms have the same meaning as those that are understood by those who skilled in the art. It must be understood that the terms defined by the dictionary are identical with the meanings within the context of the related art, and they should not be ideally or excessively formally defined unless the context clearly dictates otherwise.

Hereinafter, exemplary embodiments of the present invention will be described in more detail with reference to the accompanying drawings.

Exemplary Embodiment

FIG. 1 is a cross-sectional view of a ZnO film structure according to an exemplary embodiment of the present invention in which mask layers are formed on a substrate and a ZnO film is formed through an opened region between the mask layers.

Referring to FIG. 1, the substrate 100 may be a substrate that may be used to manufacture a general light emitting diode and may be made of any material capable of inducing growth of the ZnO film 300. For example, the substrate 100 may be made of a sapphire material, a gallium nitride material, or a ZnO material. In addition, the substrate 100 may also be provided in a form of a specific membrane. Therefore, a ZnO film or a gallium nitride film may be formed on a sapphire substrate 100.

The mask layer 200 is provided on the substrate 100. If a composition of materials configuring the mask layer is AxBy, features required for selection of the mask layer 200 are as follows.

First, bonding strength between an element A and an element B should be larger than bonding strength between the element A or the element B and oxygen.

Second, the bonding strength between the element A and the element B should be larger than bonding strength between Zn and the element A or the element B.

The first and second conditions require that bonding strengths of materials configuring the mask layer 200 are large. This is to prevent the mask layer 200 from reacting or being bonded to an oxygen or zinc element in a process of forming the ZnO film.

Third, AxBy should be in a solid state in the air and have a melting point exceeding 900° C., which is a basic growth temperature of the ZnO film 300. Third condition requires that a physical change is minimized at a high process temperature even though a process of depositing ZnO on the mask layer 200 is performed.

Fourth, AxBy should not have reactivity when it contacts ZnO or oxygen in a reaction vessel.

In the case in which the above-mentioned four conditions are satisfied, formation of a compound through reaction or bonding between ZnO and the mask layer 200 is minimized and orientation of the mask layer 200 or direct growth based on a material is suppressed.

A combination of materials of the mask layer 200 that may be used based on the above-mentioned conditions may be $AlF_3$, $NaF_2$, $SrF_2$, or $MgF_2$. For example, in $MgF_2$, bonding strength between Mg and F is 461 KJ/mol, which is larger than bonding strength (219 KJ/mol) between F and O and bonding strength (363.2 KJ/mol) between Mg and O. In addition, the bonding strength between Mg and F is larger than bonding strength (368 KJ/mol) between F and Zn. In addition, since $MgF_2$ has a high melting point of 1263° C., a physical deformation does not occur in the mask layer 200 at a growth temperature of the ZnO film 300. In the case in which $MgF_2$ is used as a material of the mask layer 200, a reaction that may be considered in the reaction vessel is represented by the following Chemical Formulas.

$MgF_2+ZnO2MgO+ZnF_2$     [Chemical Formula 1]

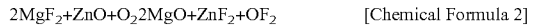

$2MgF_2+ZnO+O_22MgO+ZnF_2+OF_2$     [Chemical Formula 2]

First, Gibbs free energy depending on [Chemical Formula 1] is changed from −1391 KJ/mol into −1282 KJ/mol. This means that a spontaneous reaction does not occur. In addition, Gibbs free energy depending on [Chemical Formula 2] is changed from −2462 KJ/mol into −1811 KJ/mol, which means that a spontaneous reaction does not occur. As a result, it may be appreciated that $MgF_2$ may be used as a material of the mask layer 200 since it is not chemically bonded to ZnO.

The mask layer 200 may have various shapes. For example, the mask layer may have a stripe shape in which a lower portion thereof is partially exposed or may have an island shape. In addition, the mask layer 200 may have various shapes depending on a growth condition of the ZnO film 300 or a material of the substrate 100.

In addition, the ZnO film 300 is formed on the mask layer 200 or the substrate 100. The ZnO film 300 may be formed in an epitaxial lateral overgrowth (ELOG) scheme. The ZnO film 300 is formed based on a crystal structure of the substrate 100 disposed therebeneath. Since the substrate 100 has a structure close to a single crystal, it has a unique lattice constant. The ZnO film 300 is grown based on formed lattices and is grown in a form in which it is buried in a space between the mask layers 200 and shields an upper portion of the mask layer 200.

In FIG. 1, the mask layer 200 suppresses a reaction between the mask layer 200 and ZnO formed by a metal organic chemical vapor deposition (MOCVD) process and blocks progress of dislocation from the substrate 100. Therefore, the ZnO film 300 having low dislocation density is formed.

FIGS. 2 to 5 are cross-sectional views for describing a method of forming a ZnO film according to an exemplary embodiment of the present invention.

Figure 2:
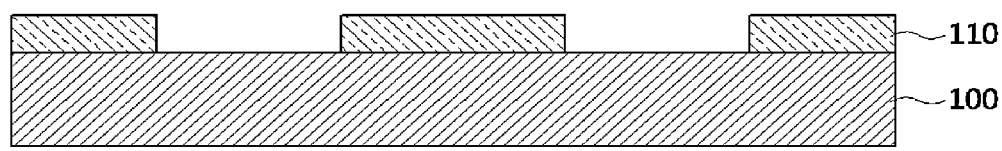
FIGS. 2 to 5 are cross-sectional views for describing a method of forming a ZnO film according to an exemplary embodiment of the present invention.

Referring to FIG. 2, photoresist patterns 110 are formed on the substrate 100. The photoresist patterns 110 are formed by a general photolithograph process. For example, a photoresist is applied and patterned to form patterns.

Figure 3:
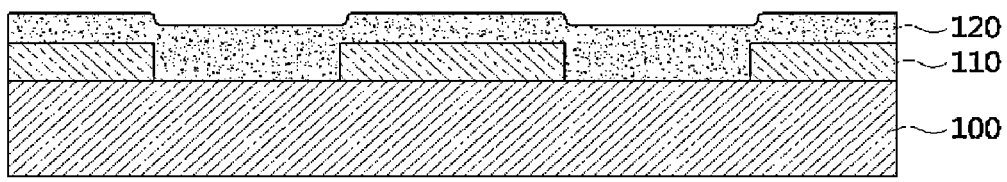

Referring to FIG. 3, a preliminary mask layer 120 is formed on the substrate 100 on which the photoresist patterns 110 are formed. The preliminary mask layer 120 is formed by E-beam deposition. For example, E-beam is irradiated on a target material, which is a material of the preliminary mask layer 120, to form the preliminary mask layer 120 on the substrate 100. The formed preliminary mask layer 120 may also completely bury the photoresist patterns 110 protruding from the substrate 100 therein depending on a process time. Since an E-beam deposition process is performed at room temperature, it may prevent damage to the photoresist patterns 110 and be performed so that a space between the photoresist patterns 110 may be buried.

Figure 4:
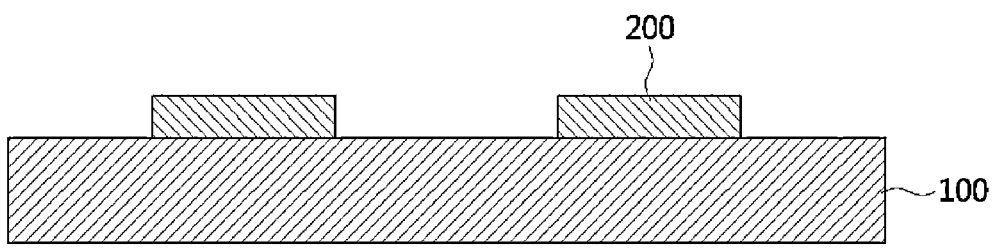

Referring to FIG. 4, the photoresist patterns are removed by a lift-off process. As a result, patterned mask layers 200 are formed. In addition, the photoresist patterns are removed, such that a portion of a surface of the substrate 100 between the mask layers 200 is exposed.

Figure 5:
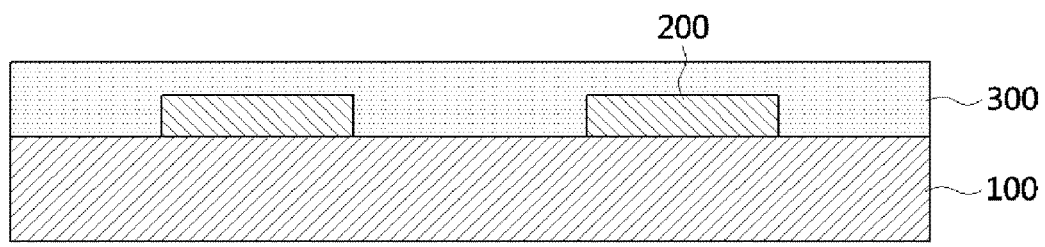

Referring to FIG. 5, the ZnO film 300 is grown based on the exposed substrate 100. The ZnO film 300 is grown in the ELOG scheme. Therefore, the ZnO film 300 grown between the mask layers 200 is simultaneously grown horizontally along the upper surface of the mask layer 200 and completely shields the mask layers 200. As a result, a high quality ZnO film 300 may be formed.

Further, in the exemplary embodiment of the present invention, the photoresist patterns are formed, the preliminary mask layers are formed, and the photoresist patterns are lifted off to form the mask layers. The mask layers may also be formed by another method. For example, the mask layers may be formed by applying the preliminary mask layer on the substrate, forming the photoresist pattern on the preliminary mask layer, and then performing selective etching. That is, the photoresist pattern may be formed on the preliminary mask layer applied to a front surface of the substrate and etching may be performed on the preliminary mask layer using the photoresist pattern as an etching mask. As a result, the patterned mask layers may be formed on the substrate.

Preparation Example

A sapphire substrate was prepared and $MgF_2$ was used as a mask layer. First, a ZnO film was primarily formed on the sapphire substrate by a MOCVD process. The ZnO film is formed by a general MOCVD process. Mask layers having shapes of stripe patterns were formed on the ZnO film by a method of FIGS. 2 to 4. A preliminary mask layer was formed by an E-beam deposition process.

An interval between the stripe patterns of the mask layers is 6.5 μm.

Then, an ELOG process was performed. At the time of performing the ELOG process, a growth temperature is 750° C., DEZn is used as a zinc precursor, and a flow rate is set to 20.1 μmol/min. In addition, a flow rate of oxygen gas is set to 66,920 μmol/min. A mole ratio of $O_2$ to DEZn is 3330.

Figure 6:
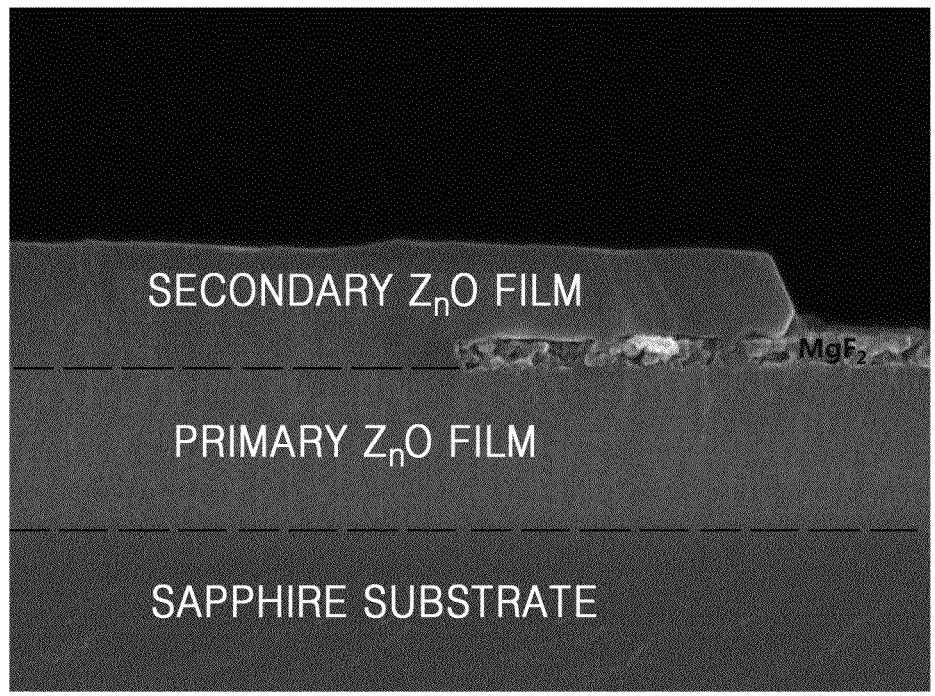
FIG. 6 is an image showing a ZnO film formed according to Preparation Example of the present exemplary embodiment.

FIG. 6 is an image showing a ZnO film formed according to Preparation Example of the present exemplary embodiment.

Referring to FIG. 6, the ZnO film is primarily formed on the sapphire substrate. The primarily formed ZnO film has a thickness of 300 to 400 nm. In addition, the mask layers made of $MgF_2$ are formed on the primarily formed ZnO film. In addition, a secondarily grown ZnO film is formed in a space between the mask layers. The primarily formed ZnO film and the secondarily grown ZnO are made of the same material and have substantially the same lattice constant, such that a difference on the image is not generated. However, a lower portion of the mask layer indicates the primarily formed ZnO film and a side and an upper portion of the mask layer indicate the secondarily grown ZnO film.

It may be appreciated through the above-mentioned Preparation Example that even through the ELOG growth method is applied, the ZnO film formed on the mask layer has high crystallinity. Therefore, a high quality ZnO film may be formed.

Figure 7:
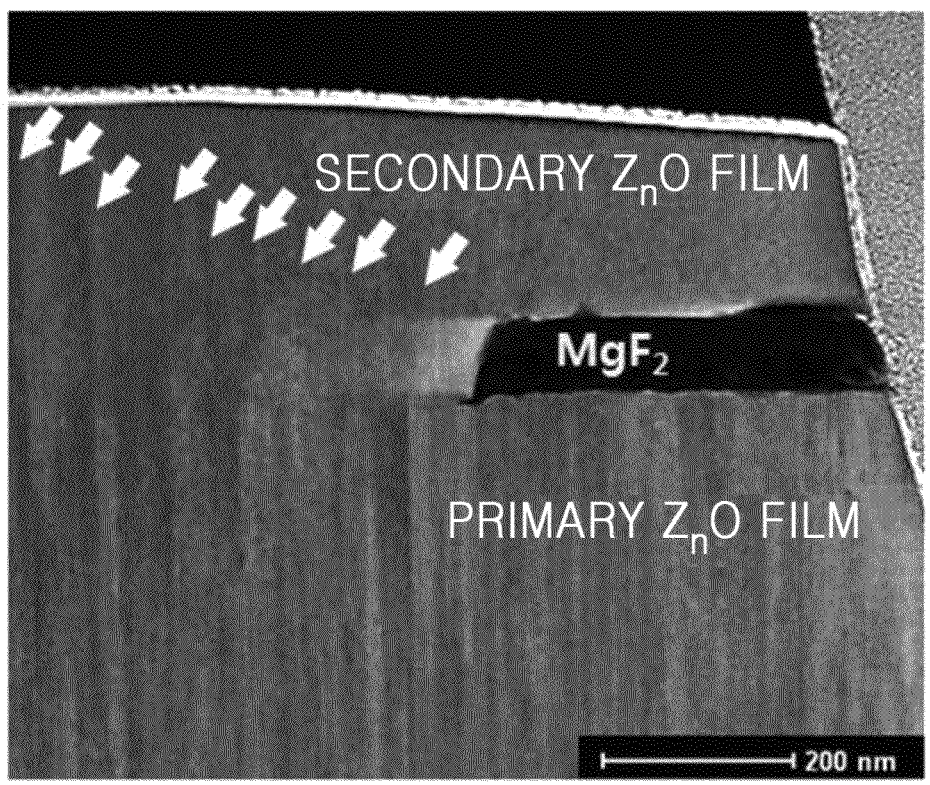
FIG. 7 is another image showing a ZnO film formed according to Preparation Example of the present exemplary embodiment.

FIG. 7 is another image showing a ZnO film formed according to Preparation Example of the present exemplary embodiment.

Referring to FIG. 7, it may be appreciated that $MgF_2$, which is a material of a mask layer, selectively blocks propagation of dislocation. That is, it may be appreciated by an arrow that dislocation is propagated to a secondary ZnO film through a primary ZnO film in a region in which the mask layer made of $MgF_2$ is not formed.

However, it may be appreciated that propagation of dislocation is not generated over the mask layer even though the ELOG growth method is applied in a region in which the mask layer made of MgF2 is formed and the mask layer blocks the propagation of the dislocation from the primary ZnO film.

The ZnO film formed according to the exemplary embodiment of the present invention described above may be used as a buffer layer or a specific conductive type semiconductor layer of a light emitting diode, or the like. For example, the ZnO film formed according to the exemplary embodiment of the present invention may be used as a buffer layer that is not doped with dopants, and an n-type ZnO semiconductor layer, a multi-quantum-well structure, and a p-type ZnO semiconductor layer may be formed on the ZnO film to thereby be used as a light emitting diode.

In addition, the ZnO film according to the exemplary embodiment of the present invention may also be used as an n-type ZnO semiconductor layer by the ELOG process through introduction of the dopants. Further, the multi-quantum-well structure and the p-type ZnO semiconductor layer may be formed on the ZnO film to thereby be used as the light emitting diode.

According to the exemplary embodiment of the present invention described above, the mask layer blocking a reaction between the mask layer and ZnO is used, such that the ZnO film may be easily formed. In addition, the mask layer blocks dislocation progressing from a substrate or another membrane disposed therebeneath. The dislocation is blocked, such that a high quality film may be formed.

What is claimed is:

1. A ZnO film structure comprising:
    a substrate;
    mask layers formed on the substrate and exposing a portion of a surface of the substrate; and
    a ZnO film burying a space between the mask layers therein and formed on an upper surface of the mask layers,
    wherein the mask layers block a reaction between the mask layers and ZnO.

2. The ZnO film structure of claim 1, wherein bonding strength between elements configuring the mask layer is larger than bonding strength between the elements configuring the mask layer and oxygen and is larger than bonding strength between the elements configuring the mask layer and zinc.

3. The ZnO film structure of claim 2, wherein the mask layer is in a solid state in the art and has a melting point exceeding 900° C.

4. The ZnO film structure of claim 3, wherein the mask layer is made of $AlF_3$, $NaF_2$, $SrF_2$, or $MgF_2$.

5. The ZnO film structure of claim 1, wherein the ZnO film includes:
    a primary ZnO film formed on the substrate by a metal organic chemical vapor deposition (MOCVD) process and formed beneath the mask layers; and
    a secondary ZnO film formed on the primary ZnO film, burying the space between the mask layers therein, and formed on the mask layers.

* * * * *